United States Patent
Jiang et al.

(10) Patent No.: US 8,841,561 B1
(45) Date of Patent: Sep. 23, 2014

(54) HIGH PERFORMANCE PCB

(75) Inventors: Xiaohong Jiang, San Jose, CA (US); Hong Shi, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/714,156

(22) Filed: Feb. 26, 2010

(51) Int. Cl.
*H05K 1/11* (2006.01)
*H05K 1/02* (2006.01)

(52) U.S. Cl.
CPC .................................. *H05K 1/0219* (2013.01)
USPC .......................................... 174/266; 174/262

(58) Field of Classification Search
CPC .............. H05K 1/0219; H05K 1/0393; H05K 2201/0715; H05K 2201/09609; H05K 2201/09627; H05K 2201/10189; H05K 3/429
USPC .......... 174/260, 262, 250; 361/818, 800, 794, 361/795, 748–751; 257/660; 29/852
See application file for complete search history.

(56) References Cited

U.S. PATENT DOCUMENTS

| | | | | |
|---|---|---|---|---|
| 5,586,011 A | * | 12/1996 | Alexander | 361/818 |
| 6,700,076 B2 | * | 3/2004 | Sun et al. | 174/262 |
| 7,016,198 B2 | * | 3/2006 | Fessler et al. | 361/780 |
| 7,277,065 B2 | * | 10/2007 | Wu et al. | 343/909 |
| 2003/0107056 A1 | * | 6/2003 | Chin et al. | 257/211 |
| 2004/0144562 A1 | * | 7/2004 | Ishikawa | 174/255 |
| 2009/0188712 A1 | * | 7/2009 | Clark et al. | 174/378 |

* cited by examiner

*Primary Examiner* — Yuriy Semenenko
(74) *Attorney, Agent, or Firm* — Ward & Zinna, LLC

(57) ABSTRACT

In one embodiment, a printed circuit board (PCB) comprises one or more signal contact pads on a surface of the PCB and a plurality of ground planes embedded in the PCB with at least the ground plane closest to the signal contact pads) having gaps in line with the trace(s). In another embodiment, a PCB comprises one or more signal traces on a first surface of the PCB, a plurality of ground planes embedded in the PCB, and at least one blind via interconnecting the ground planes. In still another embodiment, a PCB comprises one or more signal contact pads on a first surface of the PCB, a plurality of ground planes embedded in the PCB with at least the ground plane closest to the signal contact pad(s) having a gap in line with the signal contact pad(s), and at least one blind via interconnecting the ground planes. In still another embodiment, signal contact pads may be formed on both major surfaces of the PCB.

15 Claims, 4 Drawing Sheets

US 8,841,561 B1

HIGH PERFORMANCE PCB

BACKGROUND OF THE INVENTION

This relates to printed circuit boards (PCBs) for use in high performance circuits. More particularly, it relates to improvements in the interface between the PCB and a semiconductor integrated circuit package mounted on the PCB. A particular application of the invention is with high frequency transceivers.

Since their development in the 1940's, PCBs have been widely used for connecting all sorts of electrical and electronic packages. In their simplest form, PCBs comprise a layer of metal foil in which circuit paths have been defined that is laminated to an insulating substrate. More complex, multi-layer PCBs are formed by providing metal layers on both sides of the insulating substrate to form double-sided PCBs and by laminating together several single-sided and/or double-sided PCBs to form PCBs with many conducting layers. Typically, the metal used is copper; and the insulating substrate is resin-impregnated fiberglass. One widely used laminate is single-sided or double sided FR-4. Further information about PCBs is available in J. A. Scarlett (ed.), *The Multilayer Printed Circuit Board Handbook* (Electrochemical Publications Limited, 1985) and R. R. Tummala (ed.), *Fundamentals of Microsystems Packaging*, ch. 16 (McGraw-Hill, 2001), which are incorporated herein by reference.

In recent years, the frequencies of signals transmitted on some of the interconnection paths of a PCB have risen into the GigaHertz (GHz) range. At these frequencies, it becomes desirable to shield the interconnection path; and shielding structures used for many years in conventional microwave technology have been adapted for use in PCBs. FIGS. 1A and 1B depict a top view and a cross-section along line B-B in FIG. 1A of a first conventional PCB 10. In the top view, first and second signal traces 20, 22 run along a top surface 12 of PCB 10 connecting to signal contact pads 30, 32, respectively. Traces 20, 22 run between grounded contact pads 40. Note that the width of the traces is narrowed at 24 to permit them to run between the ground pads. Typically, signal contact pads 30, 32 are located near an outer edge of PCB 10 and the narrow portion 24 of traces 20, 22 is relatively short. As shown in the cross-section of FIG. 1B, PCB 10 is formed in a micro-strip configuration with several ground planes 50 that provide a current return path. The ground planes underlie the signal traces and are separated from each other by insulating layers 60. The ground planes are continuous two-dimensional metal sheets with no openings that are connected together by columns of through vias 70 that extend from contact pads 40 on top surface 12 of the PCB to a bottom surface 14 of the PCB.

Illustratively, PCB 10 is electrically and mechanically connected to a semiconductor integrated circuit package 80 by solder balls or solder bumps 90, 92, 94 on contact pads 30, 32, 40, respectively.

FIGS. 2A and 2B depict a bottom view and a cross-section along line B-B in FIG. 2A of a second conventional PCB 210. In the bottom view, first and second signal traces 220, 222 run along a bottom surface 214 of PCB 210 connecting to signal contact pads 234, 236, respectively. As shown in the cross-section of FIG. 2B, PCB 210 is formed in a micro-strip configuration with several ground planes 250 that are separated from each other by insulating layers 260. The signal contact pads 234, 236 are connected to contact pads 230, 232 on top surface 212 of the PCB by through vias 272, 274 that are electrically isolated from the ground planes by gaps in the planes. Except for the gaps in the ground planes that isolate them from through vias 272, 274, the ground planes are continuous two-dimensional metal sheets with no openings that are connected together by columns of through vias 270 that extend from contact pads 240 on a top surface 212 of the PCB to bottom surface 214 of the PCB.

Signal traces 220, 222 run between vias 270 on bottom surface 214. The width of the traces is narrowed at 224 to permit them to run between the vias. Typically, signal contact pads 234, 236 are located more toward the interior of the PCB and the narrow portion of traces 220, 222 is much longer than the narrow portion of typical signal traces 20, 22 on top surface 212.

Illustratively, PCB 210 is electrically and mechanically connected to a semiconductor integrated circuit package by solder balls or solder bumps 290, 292, 294 on contact pads 230, 232, 240, respectively, on top surface 212 of PCB 210.

SUMMARY OF THE PRESENT INVENTION

Unfortunately, capacitive effects and PCB discontinuities can add 5-10 dB return loss degradation to losses that arise from the package design. The present invention reduces such losses.

In a preferred embodiment of the invention, a PCB comprises one or more signal contact pads on a surface of the PCB and a plurality of ground planes embedded in the PCB with at least the ground plane closest to the signal contact pad(s) having a gap underneath each signal contact pad.

In another embodiment of the invention, a PCB comprises one or more signal contact pads on a first surface of the PCB, a plurality of ground planes embedded in the PCB, and blind vias that interconnect the ground planes.

In still another embodiment of the invention, a PCB comprises one or more signal contact pads on a first surface of the PCB, a plurality of ground planes embedded in the PCB with at least the ground plane closest to the signal contact pad(s) having a gap underneath each signal contact pad, and blind vias that interconnect the ground planes.

Numerous variations may be practiced in the preferred embodiments. For example, signal contact pads may be formed on both major surfaces of the PCB.

BRIEF DESCRIPTION OF THE DRAWINGS

These and other objects and advantages of the present invention will be apparent to those of ordinary skill in the art in view of the following detailed description in which.

DETAILED DESCRIPTION

Figure 3:
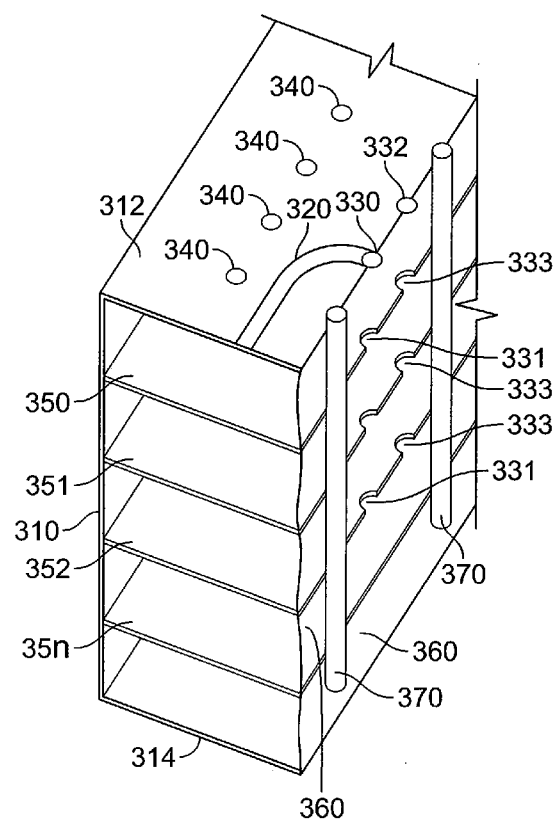
FIG. 3 is a perspective view of an illustrative embodiment of the invention.

FIG. 3 is a perspective view of an illustrative embodiment of a PCB 310 of the present invention. First and second signal traces 320, 322 run along a top surface 312 of PCB 310 connecting to signal contact pads 330, 332, respectively. Traces 320, 322 run between grounded contact pads 340. PCB 310 is formed in a micro-strip configuration with several metal ground planes 350, 351, 352, 35n that are separated from each other by insulating layers 360. The ground planes are connected together by columns of through vias 370 that extend from contact pads 340 on top surface 312 of the PCB to a bottom surface 314 of the PCB.

In accordance with the invention, insertion losses and return losses are reduced by forming the ground planes so that at least the ground plane closest to top surface 312 has gaps 331, 333 in line with the signal contact pads 330, 332 on top surface 312. In particular, each gap is at least as wide as the diameter of the contact pad it underlies and preferably is about twice as wide. Gaps may be present in several (but not all) of the ground planes and for purposes of illustration are depicted in FIG. 3 in the upper three ground planes.

Illustratively, PCB 310 is electrically and mechanically connected to a semiconductor integrated circuit package (not shown) by solder balls or solder bumps on contact pads 330, 332, 340.

Figures 4A, 4B:
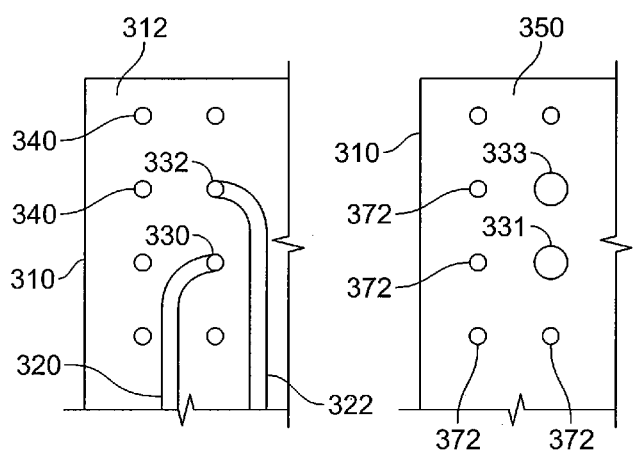
FIGS. 4A-4C are plan views of the top surface and two ground planes of the embodiment of FIG. 3.
Figure 4C:
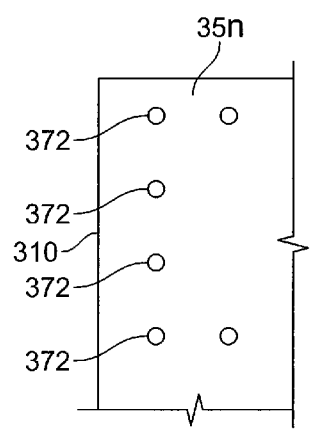

FIGS. 4A-4C are plan views depicting upper surface 312, ground plane 350 and ground plane 35n of FIG. 3. As shown in FIG. 4A, signal traces 320, 322 run between grounded contact pads 340 on the top surface 312 of PCB 310 connecting to contact pads 330, 332, respectively As shown in FIG. 4C, ground plane 35n is a continuous two-dimensional metal sheet with no openings. Circles 372 indicate where through vias 370 contact ground plane 35n to connect it to the other ground planes in the PCB 310 and to contact pads 340. PCB 310 includes at least one ground plane 35n, typically on the lowest ground plane level and may have several such ground planes.

As shown in FIG. 4B, ground plane 350 is a metal sheet having gaps 331, 333 in line with signal contact pads 330, 332 on top surface 312. Preferably, the width of each gap 331, 333 is at least as wide as the diameter of the contact pad it underlies and preferably is about twice as wide. Illustratively, for a contact pad that has a diameter of 635 μm, the diameter of the gap is about 1.3 mm. Circles 372 indicate where through vias 370 contact ground plane 350 to connect it to the other ground planes in PCB 310 and to contact pads 340. PCB 310 has at least one ground plane 350 with one or more gaps and that ground plane is located closest to the signal contact pad(s) on the surface of the PCB 310. PCB 310 may have several such ground planes stacked one on top of the other separated by insulating layers 360.

Figure 1A:
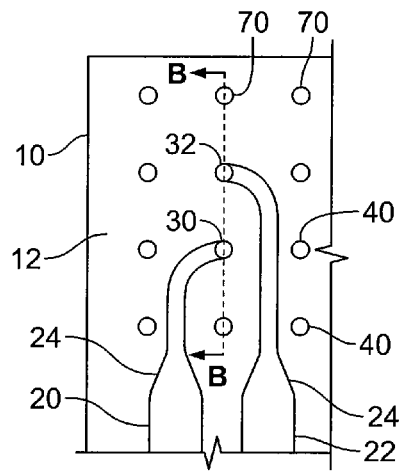
FIGS. 1A-1B are a top view and cross-section of an illustrative prior art PCB.
Figure 1B:
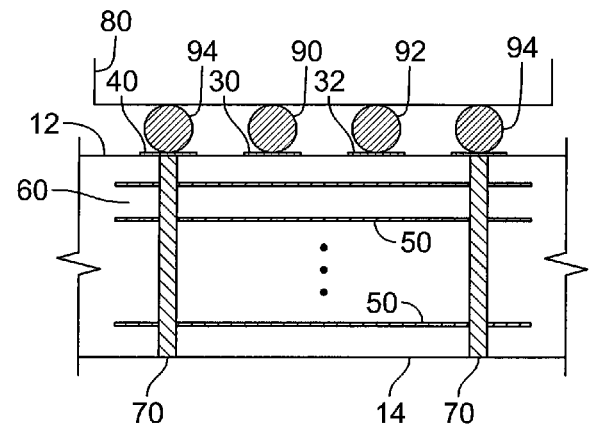
Figure 5:
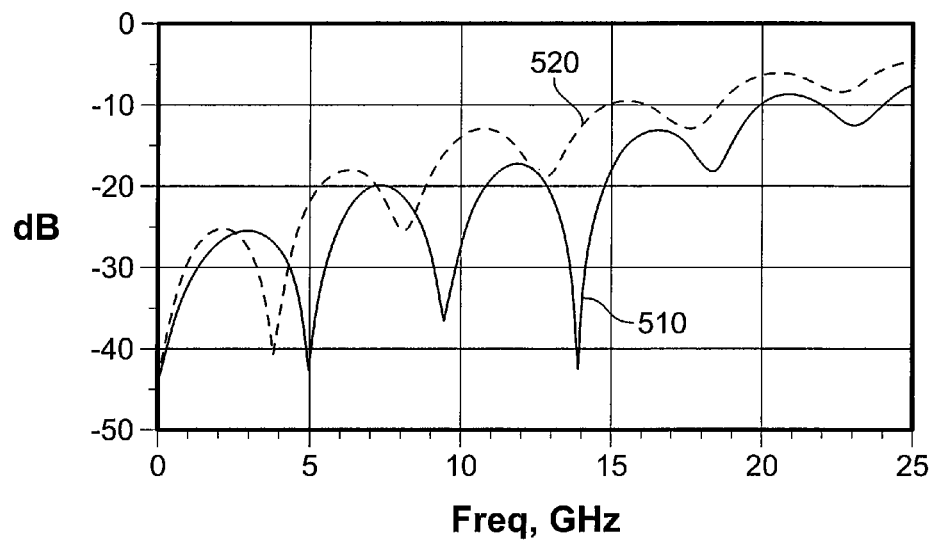
FIG. 5 is a plot of differential return loss versus operating frequency for the embodiment of FIG. 3 and for a prior art PCB.

FIG. 5 is a plot of differential return loss versus operating frequency for the embodiment of FIG. 3 that has a gap in the ground plane under the signal traces versus a prior art PCB such as that shown in FIGS. 1A and 1B that has a solid (or continuous) ground plane under the signal traces. The loss for the device of FIG. 3 is represented by line 510 and the loss for the prior art device is represented by line 520. As is apparent, there is a 4-5 dB improvement for the device of FIG. 3 over the prior art device with a solid ground plane.

Figure 6A:
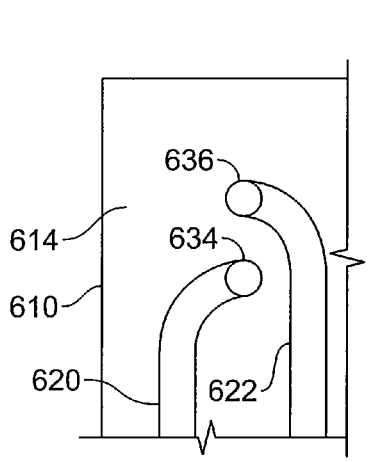
FIGS. 6A and 6B are a bottom view and a cross-section of a second illustrative embodiment of the invention.
Figure 6B:
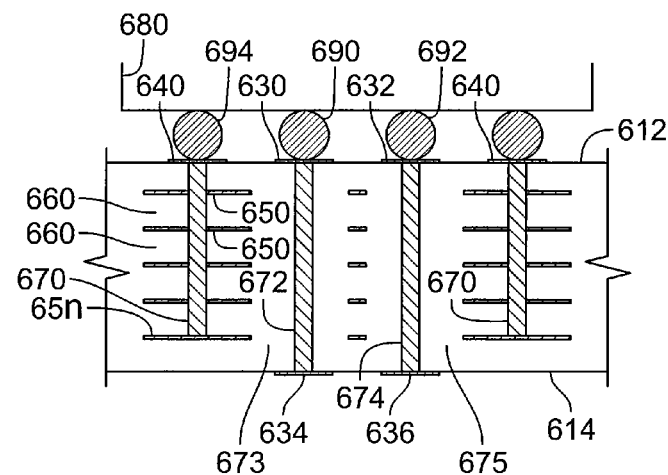

FIGS. 6A and 6B are a bottom view and a cross-section of a second illustrative embodiment of the invention. In the bottom view, first and second signal traces 620, 622 run along a bottom surface 614 of PCB 610 connecting to signal contact pads 634, 636, respectively. As shown in the cross-section of FIG. 6B, PCB 610 is formed in a micro-strip configuration with several ground planes 650 that are separated from each other by insulating layers 660. The ground planes are connected together by columns of blind vias 670 that extend from contact pads 640 on a top surface 612 of the PCB to the lowest ground plane 65n of the PCB. The signal contact pads 634, 636 are connected to contact pads 630, 632 on top surface 612 of the PCB by through vias 672, 674 that are electrically isolated from the ground planes by gaps 673, 675 in the ground plane. Except for gaps 673, 675, the ground planes are continuous two-dimensional metal sheets with no openings.

Illustratively, PCB 610 is electrically and mechanically connected to a semiconductor integrated circuit package 680 by solder balls or solder bumps 690, 692, 694 on contact pads 630, 632, 640, respectively, on top surface 612 of PCB 610.

As is apparent from FIGS. 6A and 6B, the vias 670 do not extend all the way through PCB 610 to bottom surface 614. As a result, the via stub from the bottommost ground plane to the bottom surface and any via landing area on the bottom surface are eliminated, thereby removing a significant source of performance degradation. Since the ground vias do not reach the bottom surface, there are also no ground via contact pads on the bottom surface, thereby eliminating any need to narrow the width of the signal traces to avoid the ground pads. As a result, the signal traces can maintain a constant impedance (e.g., 50 Ohm) along the entire length of the traces and avoid the discontinuities imposed on the traces of the prior art PCB of FIGS. 2A and 2B. The lack of ground pads also provides more room for other signal routing.

Figure 2A:
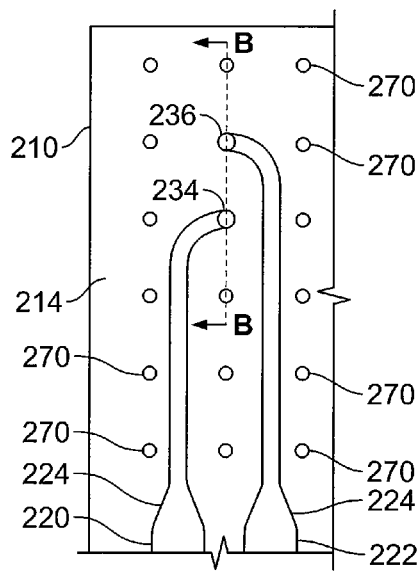
FIGS. 2A-2B are a bottom view and cross-section of a second illustrative prior art PCB.
Figure 2B:
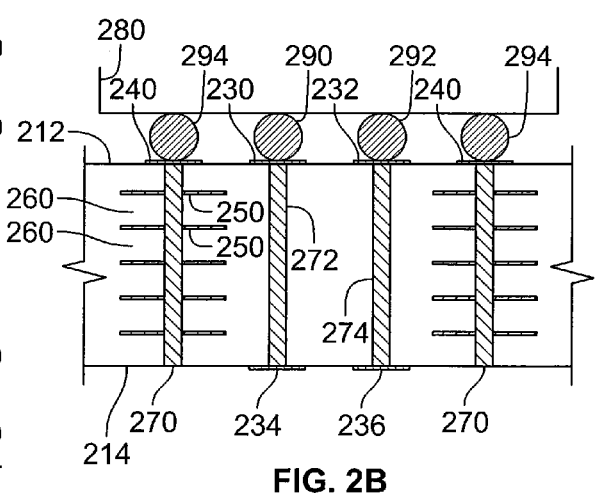
Figure 7:
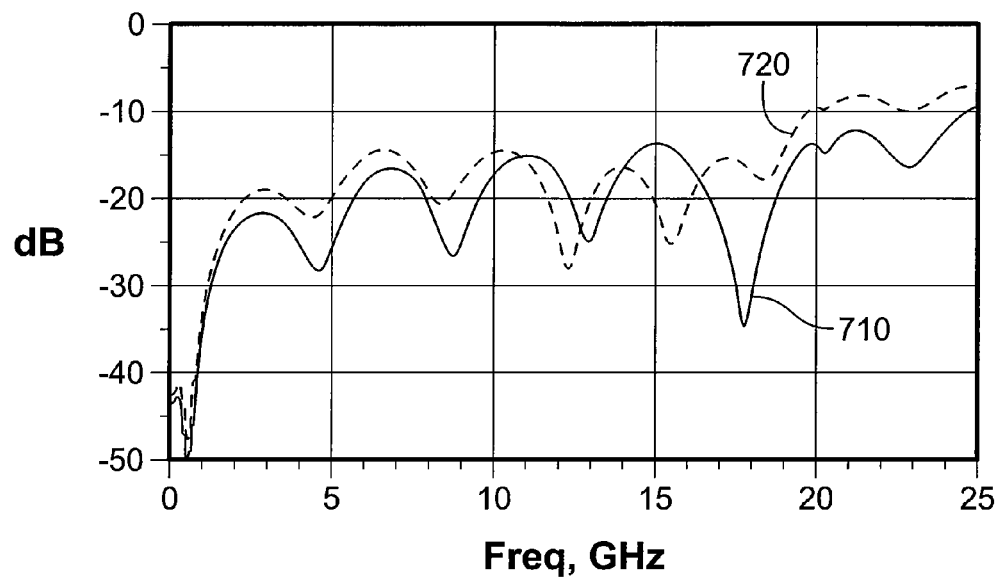
FIG. 7 is a plot of differential return loss versus operating frequency for the embodiment of FIGS. 6A and 6B and for a prior art PCB.

FIG. 7 is a plot of differential return loss versus operating frequency for the embodiment of FIGS. 6A and 6B that uses blind vias to connect the ground planes versus a prior art PCB such as that shown in FIGS. 2A and 2B that uses through vias to connect the ground planes. The loss for the device of FIGS. 6A and 6B is represented by line 710 and the loss for the prior art device is represented by line 720. As is apparent, differential return loss was improved by about 2-3 dB up to about 10 GHz and about 5 dB above 20 GHz.

Figure 8:
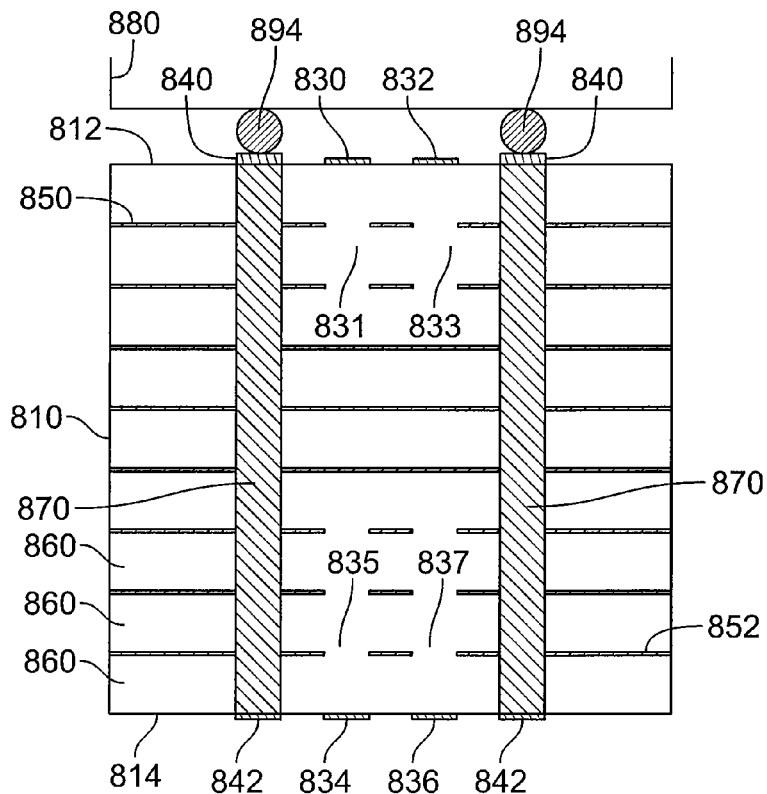
FIG. 8 is a cross-section of a third illustrative embodiment of the invention.

FIG. 8 is a cross-section of another illustrative embodiment of a PCB 810 of the present invention where signal traces are present on both the top and bottom surfaces of the PCB. First and second signal traces (not shown) run along a top surface 812 of PCB 810 connecting to signal contact pads 830, 832 on surface 812. The traces run between grounded contact pads 840. Third and fourth signal traces (not shown) run along a bottom surface 814 of PCB 810 connecting to signal contact pads 834, 836 on surface 814. The traces 824, 826 run between grounded contact pads 842.

PCB 810 is formed in a micro-strip configuration with several ground planes 850 that provide a current return path. The ground planes are separated from each other by insulating layers 860 and are connected together by columns of through vias 870 that extend from contact pads 840 on top surface 812 of the PCB to contact pads 842 on bottom surface 814 of the PCB. In accordance with the invention, at least the ground plane 850 closest to top surface 812 has gaps 831, 833 in line with the signal contact pads 830, 832 on top surface 812; and at least the ground plane 852 closest to bottom surface 814 has gaps 835, 837 in line with the signal contact pads 834, 836 on bottom surface 814. In particular, gaps 831, 833 in ground plane 850 are at least as wide as the diameter of the signal contact pads 830, 832 they underlie; and the gaps 835, 837 in ground plane 852 are at least as wide as the diameter of the signal contact pads 834, 836 they overlie. Preferably, the diameter of each gap is at least twice the diameter of the signal contact pad that it underlies or overlies. Gaps may be present in several of the ground planes and for purposes of illustration are depicted in FIG. 8 in the upper two ground planes and the lower three ground planes.

Illustratively, PCB 810 is electrically and mechanically connected to a semiconductor integrated circuit package 880 by solder balls 894 or solder bumps on contact pads on the upper surface of PCB 810. PCB 810 may also be connected to a semiconductor integrated circuit package (not shown) by solder balls or solder bumps on the contact pads on the bottom surface of the PCB.

As will be apparent to those skilled in the art, numerous variations may be practiced within the spirit and scope of the present invention. For example, the number of signal contact pads may vary; and the number of layers with gaps underlying or overlying the contact pads may also vary.

What is claimed is:

1. A printed circuit board (PCB) having first and second major surfaces comprising:
   at least one signal contact pad on the first major surface of the PCB;
   a signal lead extending across the first major surface of the PCB and connecting to the signal contact pad;
   at least three conducting ground planes extending through the PCB parallel to one another,
   a non-conducting gap in at least the ground plane closest to the first major surface of the PCB, said non-conducting gap being in line with the signal contact pad on the first major surface;
   at least one signal contact pad on the second major surface of the PCB;
   a signal lead extending across the second major surface of the PCB and connecting to the signal contact pad on the second major surface of the PCB;
   a non-conducting gap in at least the ground plane closest to the second major surface of the PCB, said non-conducting gap being in line with the signal contact pad on the second major surface;
   at least one conducting ground plane between the ground plane closest to the first major surface of the PCB and the ground plane closest to the second major surface of the PCB; and
   a ground connection that connects to all the ground planes and extends to the ground planes from one of the first and second major surfaces of the PCB but not the other major surface.

2. The printed circuit board of claim 1 wherein each gap has an interior width that is equal to or larger than an outer width of the signal contact pad it underlies.

3. The printed circuit board of claim 1 wherein each gap has an interior width that is equal to or larger than an outer width of the signal contact pad it underlies.

4. The printed circuit board of claim 1 wherein the ground planes are connected by vias.

5. The printed circuit board of claim 1 wherein there is an insulating layer between the first major surface and the ground plane closest to the first major surface.

6. The printed circuit board of claim 1 wherein there is an insulating layer between each of the ground planes.

7. A printed circuit board (PCB) having first and second major surfaces comprising:
   at least one signal contact pad on the first major surface of the PCB;
   a signal lead extending across the first major surface of the PCB and connecting to the signal contact pad;
   a at least three metallic ground planes extending through the PCB parallel to one another,
   a non-metallic gap in at least the ground plane closest to the first major surface of the PCB, said non-metallic gap being in line with the signal contact pad on the first major surface;
   at least one signal contact pad on the second major surface of the PCB;
   a signal lead extending across the second major surface of the PCB and connecting to the signal contact pad on the second major surface of the PCB;
   a non-conducting gap in at least the ground plane closest to the second major surface of the PCB, said non-conducting gap being in line with the signal contact pad on the second major surface;
   at least one metallic ground plane between the ground plane closest to the first major surface of the PCB and the ground plane closest to the second major surface of the PCB; and
   a ground connection that connects to all the ground planes and extends to the ground planes from one of the first and second major surfaces of the PCB but not the other major surface.

8. The printed circuit board of claim 7 wherein each gap has an interior width that is equal to or larger than an outer width of the signal contact pad it underlies.

9. The printed circuit board of claim 7 wherein there is an insulating layer between the first major surface and the ground plane closest to the first major surface.

10. The printed circuit board of claim 7 wherein there is an insulating layer between each of the ground planes.

11. The printed circuit board of claim 10 wherein the ground planes are connected by vias through the insulating layers.

12. A printed circuit board (PCB) having first and second major surfaces comprising:
    at least one signal contact pad on the first major surface of the PCB;
    a signal lead extending across the first major surface of the PCB and connecting to the signal contact pad;
    at least three metallic ground planes extending through the PCB parallel to one another,
    an insulating layer between each of the ground planes,
    a non-metallic gap in at least the ground plane closest to the first major surface of the PCB, said non-metallic gap being in line with the signal contact pad on the first major surface; and
    at least one metallic ground plane underneath the non-metallic gap in line with the signal contact pad on the first major surface
    at least one signal contact pad on a second major surface of the PCB;
    a signal lead extending across the second major surface of the PCB and connecting to the signal contact pad on the second major surface of the PCB;
    a non-conducting gap in at least the ground plane closest to the second major surface of the PCB, said non-conducting gap being in line with the signal contact pad on the second major surface;
    at least one metallic ground plane between the ground plane closest to the first major surface of the PCB and the ground plane closest to the second major surface of the PCB; and
    a ground connection that connects to all the ground planes and extends to the ground planes from one of the first and second major surfaces of the PCB but not the other major surface.

13. The printed circuit board of claim 12 wherein each gap has an interior width that is equal to or larger than an outer width of the signal contact pad it underlies.

14. The printed circuit board of claim 12 wherein there is an insulating layer between the first major surface and the ground plane closest to the first major surface.

15. The printed circuit board of claim 12 wherein the ground planes are connected by vias through the insulating layers.

* * * * *